United States Patent [19]

Miller

[11] Patent Number: 5,952,738
[45] Date of Patent: Sep. 14, 1999

[54] SWITCHING CIRCUIT FOR AN INDUCTIVE LOAD

[75] Inventor: Peter Miller, Shefford, United Kingdom

[73] Assignee: Motorola, Inc., Schaumburg, Ill.

[21] Appl. No.: 08/798,945

[22] Filed: Feb. 11, 1997

[30] Foreign Application Priority Data

Feb. 15, 1996 [GB] United Kingdom .................. 9603181
Sep. 20, 1996 [GB] United Kingdom .................. 9619721

[51] Int. Cl.$^6$ .................................................. H01H 47/00
[52] U.S. Cl. ......................... 307/116; 327/110; 327/139; 327/551; 361/156; 361/159; 363/39
[58] Field of Search .................................. 307/116, 105, 307/127; 361/156, 159, 111; 327/110, 139, 551; 363/39, 44

[56] References Cited

U.S. PATENT DOCUMENTS

| 3,708,726 | 1/1973 | Puvogel | 361/156 |
| 4,775,914 | 10/1988 | Incardona | 361/159 |
| 4,839,769 | 6/1989 | Soo et al. | 361/111 |
| 5,148,358 | 9/1992 | Estes | 363/24 |
| 5,402,331 | 3/1995 | Takahashi | 363/44 |
| 5,523,632 | 6/1996 | Seragnoli | 307/125 |

*Primary Examiner*—Albert W. Paladini
*Attorney, Agent, or Firm*—Nicholas C. Hopman

[57] ABSTRACT

In a circuit, switch (1) switches a current from a reference voltage terminal through an inductive element (3). The energy stored in the magnetic field associated with the inductive element when a current is flowing is transferred on interruption of the current either capacitively or inductively to an energy storage element (4). The stored energy is then returned to re-energize the inductive element (3) when the current flow is restored by the switch (1).

7 Claims, 6 Drawing Sheets

FIG.14

SWITCHING CIRCUIT FOR AN INDUCTIVE LOAD

FIELD OF THE INVENTION

This invention relates to a switching circuit for an inductive load and more particularly to a highly efficient switching circuit that reduces energy loss when the current through an inductive load is switched on and off.

BACKGROUND OF THE INVENTION

Many electrical circuits in a wide range of technical fields rely on inductive elements, such as solenoids, electromagnetic valves, contactors, relays or electric motor drives, driven as a load for their operation.

With any circuit containing an inductive load, however, a problem occurs when the current through the load is switched off. Since the voltage across an inductor is proportional to the rate of change of inductor current, then any attempt to rapidly switch off the load current results in a large voltage spike, which can damage or destroy components in the driving circuit. This problem is due to the energy stored by the load current within the magnetic field of the inductor being returned abruptly to the inductor coils as the magnetic field collapses. In conventional circuits containing an inductive load, the energy contained within the magnetic field is dissipated as heat by using a circuit such as a snubber network or a catch diode that diverts the voltage spike to a reference voltage, usually ground.

There is an additional problem with conventional circuits employing inductive loads that exhibit limited mechanical movement, such as solenoids, electromagnetic valves, contactors or relays. When such circuits are switched on, the energising current needs to be such that the magnetic field quickly rises to a level to create the initial pull; however, if the current is not reduced quickly at this time, then power loss is incurred as heat as the movement of the device is abruptly halted.

In battery-powered equipment or any device that must run at low powers or low temperatures, this wasted energy and the heat it causes in both of the above examples can be a significant problem.

A review of inductive drive circuits is given in "Noise Reduction Techniques in Electronic Systems", 2nd edition by Henry W. Ott, published by John Wiley & sons, 1988, pp216–223.

This invention seeks to provide an improved switching circuit for an inductive load that mitigates the above mentioned disadvantages.

SUMMARY OF THE INVENTION

A switching circuit switches a current from a reference voltage terminal through an inductive load. Energy stored in a magnetic field, associated with the inductive load when a current is flowing, is transferred, either capacitively or inductively, on interruption of the current, to an energy storage element. The stored energy is then returned to re-energise the inductive load when the current flow is restored by the switching circuit.

BRIEF DESCRIPTION OF THE DRAWINGS

Exemplary embodiments of the invention will now be described with reference to the drawings in which.

DETAILED DESCRIPTION OF PREFERRED EMBODIMENTS

Figure 1:
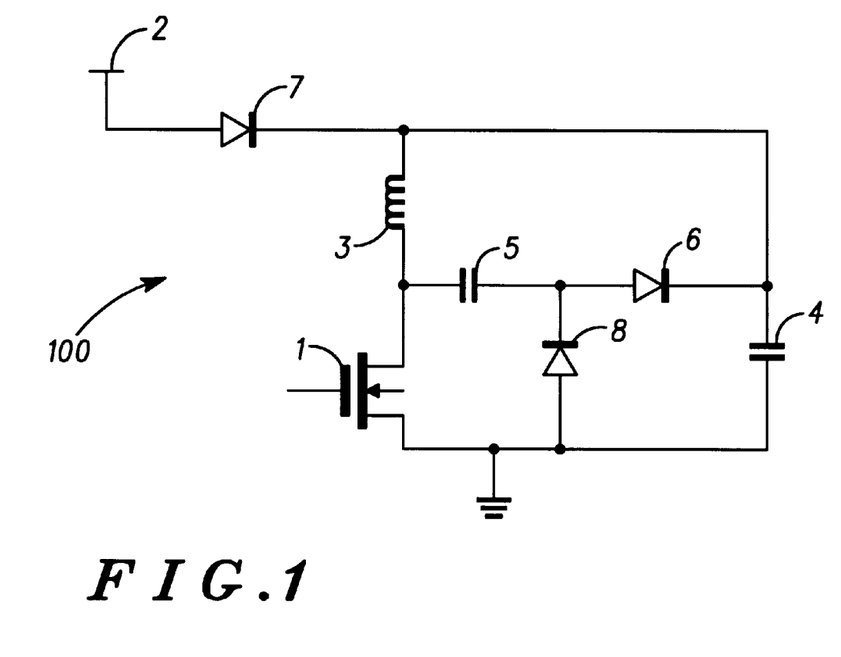
FIG. 1 slows a circuit diagram of a switching circuit for an inductive load in accordance with a first embodiment of the invention.

Referring to FIG. 1 there is shown a switching circuit 100 in accordance with a first embodiment of the invention comprising a switch 1 which controls the load current from a first reference voltage terminal 2, typically a power supply voltage, through an inductive element 3. Although in the example shown, switch 1 is a field effect transistor (FET), it may be replaced by any suitable switching element. Moreover, the inductive element 3 may be a commonly used component such as a relay or a solenoid, but may of course be any circuit component that exhibits a significant inductance.

Energy storage means 4 are coupled to the inductive element 3 in order to store the energy contained within the magnetic field of the inductive element. It is convenient to store the energy contained within the magnetic field of the inductive element on a capacitor, but other storage elements could be used.

As an aid to understanding how the inventive circuit functions, the sequence of events following the transition of switch 1 from a closed to an open position will first be described:

When switch 1 is in a closed state, a steady current flows from the first reference voltage terminal 2 through the inductive element 3 to a second reference voltage, in the present example ground. In this mode of operation storage capacitor 4 is charged to the level of the first reference voltage.

When switch 1 is opened, the current through inductive element 3 rapidly decreases, causing a voltage spike to appear across it, as is well known in the prior art. However, rather than dissipating the energy in the voltage spike in the conventional manner, in the circuit of FIG. 1 the voltage spike is passed via coupling capacitor 5 and diode 6 to storage capacitor 4. Since the voltage spike typically has a peak value much greater than the reference voltage, it causes additional charge to be stored on the storage capacitor 4, increasing the voltage across the storage capacitor 4. Diode 7 is provided to prevent the charge stored on the storage capacitor 4 in this way from leaking away to the reference terminal 2.

Hence, the energy contained in the magnetic field of the inductive element 3 is effectively transferred onto storage capacitor 4 by the switching circuit 100 of FIG. 1 with only energy losses due to capacitor 5 and diode 6 reducing the efficiency of the transfer process. Moreover, the inventive circuit also enables the energy stored on storage capacitor 4 to be returned to the inductive element 3, as will now be explained:

When switch 1 is closed again a current will flow through the inductive element 3, establishing a magnetic field therein for which energy is required. If the switch is closed again after a time interval that is small compared to the discharge rate of storage capacitor 4, then the voltage across the storage capacitor 4 is still larger than the reference voltage at terminal 2 so that diode 7 remains reverse biased. This means that the initial current supplied to the inductive element 3 originates in the storage capacitor 4 and represents the energy stored on storage capacitor 4 after the end of the previous on-phase of the switch 1. As charge leaves storage capacitor 4 to supply the current for inductive element 3, the voltage across the capacitor decreases until it is approximately equal to the first reference voltage, at which point diode 7 becomes forward biased and the current through the inductive element is once again provided by the first reference voltage at terminal 2.

As a consequence of the high initial voltage supplied by the storage capacitor 4 to the inductive element 3 when the switch is closed, the current flowing through the inductive element increases initially at a faster rate than for a conventional circuit, where the reference voltage supply is simply switched across the inductive element. Once the additional charge stored on the storage capacitor 4 has been dissipated through the inductive element 3, the current required to maintain the magnetic field is provided by the reference voltage supply in the normal manner. Hence the voltage supplied by the inventive circuit to the inductive element 3, namely an initial high voltage that decays away to the level of the reference voltage supply, is well suited to applications where the inductive element requires energy for an initial pull followed by a reduced current requirement.

The skilled reader will note that the network of capacitor 5 and diodes 6 and 8 in FIG. 1 effectively shifts the dc voltage level between the inductive element 3 and the storage capacitor 4, permitting the voltage spike caused by the switch opening to be passed onto the storage capacitor 4 with only a small amount of charge from capacitor 5 being dissipated to ground on each cycle via a current path through diode 8.

Figure 2:
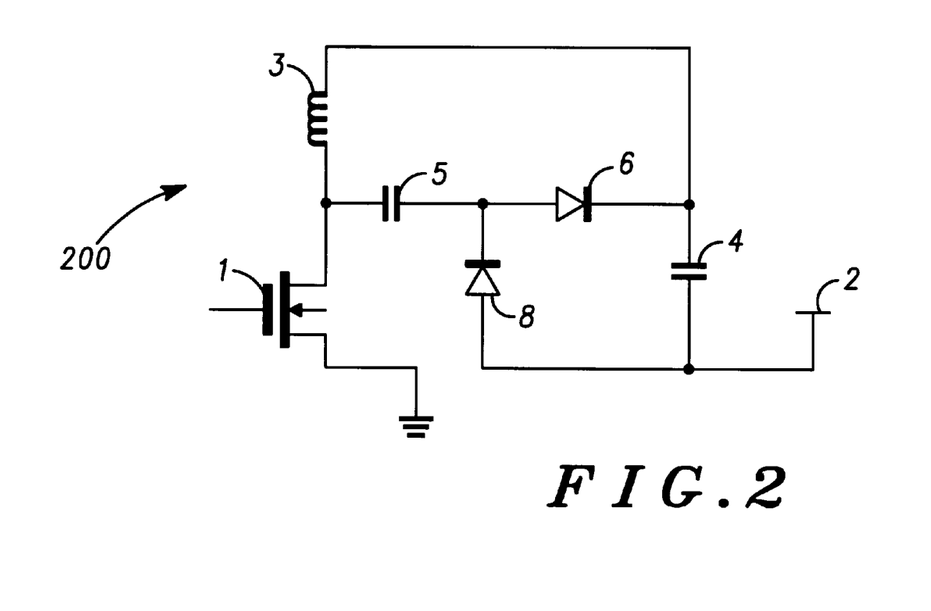
FIG. 2 shows a circuit diagram of a switching circuit for an inductive load in accordance with a second embodiment of the invention.

FIG. 2 shows a second embodiment of the invention. Like components to those in FIG. 1 have been given the same reference numerals. The switching circuit 200 of FIG. 2 exploits the fact that for a dc signal the inductive element 3 is effectively decoupled by capacitor 5 and diode 8 from storage capacitor 4; hence it is actually possible to connect the ground electrode of storage capacitor 4 of FIG. 1 to any reference potential without altering the energy storing function of the circuit. Accordingly, in the circuit of FIG. 2, this electrode has been coupled to the first reference voltage terminal 2, which in the preferred embodiment is the power supply. This arrangement means that the diode 7 of FIG. 1 is no longer required, as the function of preventing stored charge leaking to the first reference voltage terminal 2 is taken over by diodes 6 and 8.

The embodiment of FIG. 2 has the advantage of requiring one component less than the circuit of FIG. 1, although energy loss through diodes 6 and 8 when switch 1 is closed will be slightly greater than for the single diode 7 of the embodiment of FIG. 1.

The embodiments of FIGS. 1 and 2 provide an extremely simple and convenient way of storing and recovering energy from a switched inductive load, requiring only standard components to achieve this result. Moreover, in both of these embodiments when switch 1 is closed the transition between the initial state in which current for the inductive element 3 is provided by the storage capacitor 4 and the subsequent state in which the current is provided by the power supply occurs automatically and without delay. This means that full synchronisation between the stored energy and the regular power supply is obtained without the need for complicated external switching circuits.

Figure 3:
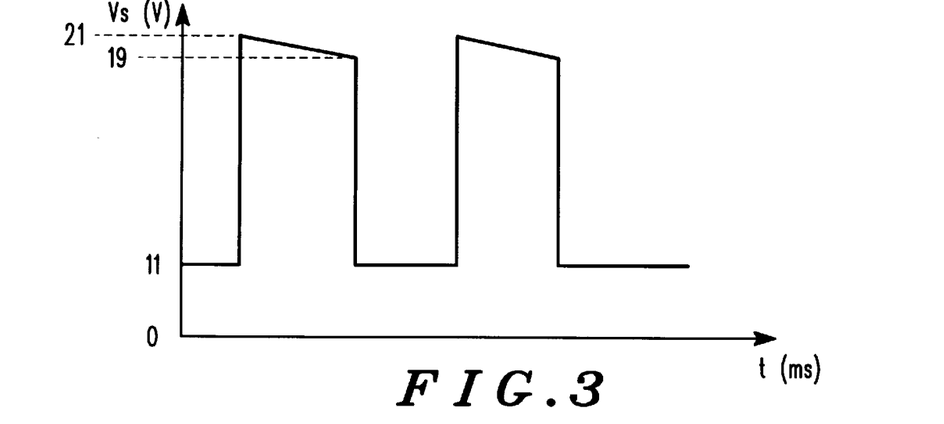
FIG. 3 is a representation of the voltage pulses seen on the storage capacitor in the circuit of FIG. 1 as the current through the inductive element is switched on and off for first selected values of capacitance.
Figure 4:
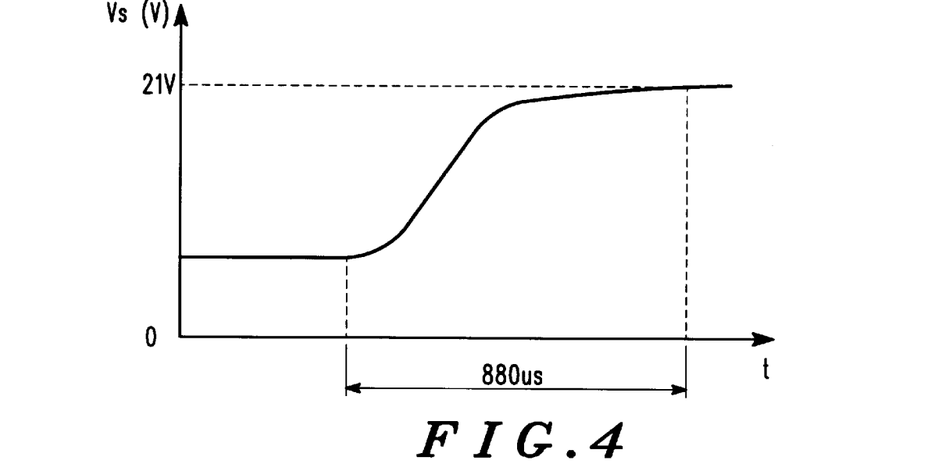
FIG. 4 is a representation of the rise time of the pulses shown in FIG. 3.
Figure 5:
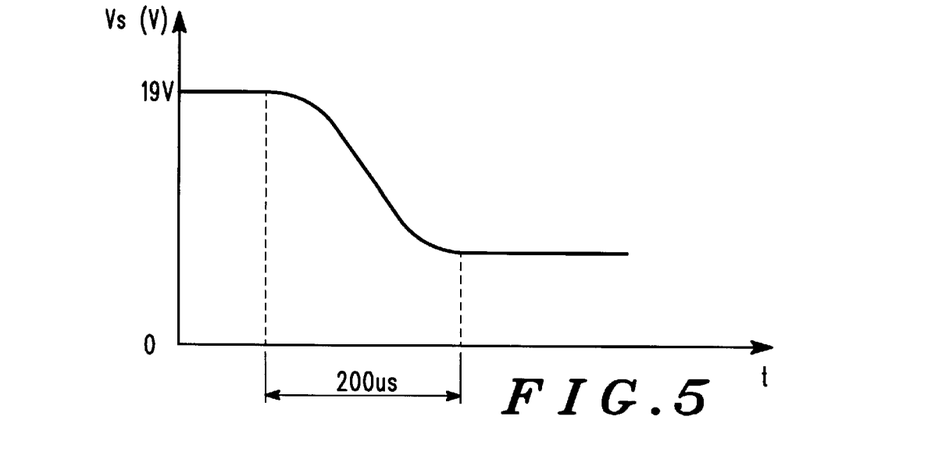
FIG. 5 is a representation of the fall time of the pulses show in FIG. 3.

In the first two embodiments the actual values of capacitors 4 and 5 are not critical to the performance of the invention, although their relative sizes do affect the amount of charge stored on each cycle. This is illustrated by FIGS. 3 to 11, which show the development of the voltage across the storage capacitor 4 in the circuit of FIG. 1 as the current is switched on and off by switch 1 for three different cases:

Case 1. FIG. 3 shows the voltage level at the storage capacitor 4 when capacitors 4 and 5 are respectively chosen to have values of 100 nF and 10 nF. FIGS. 4 and 5 respectively show the rise and fall times of the voltage pulses shown in FIG. 3.

Figure 6:
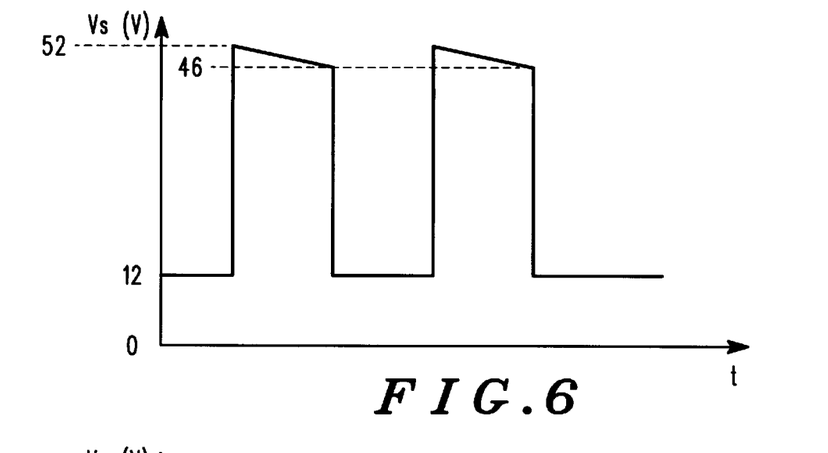
FIG. 6 is a representation of the voltage pulses seen on the storage capacitor in the circuit of FIG. 1 as the current through the inductive element is switched on and off for second selected values of capacitance.
Figure 7:
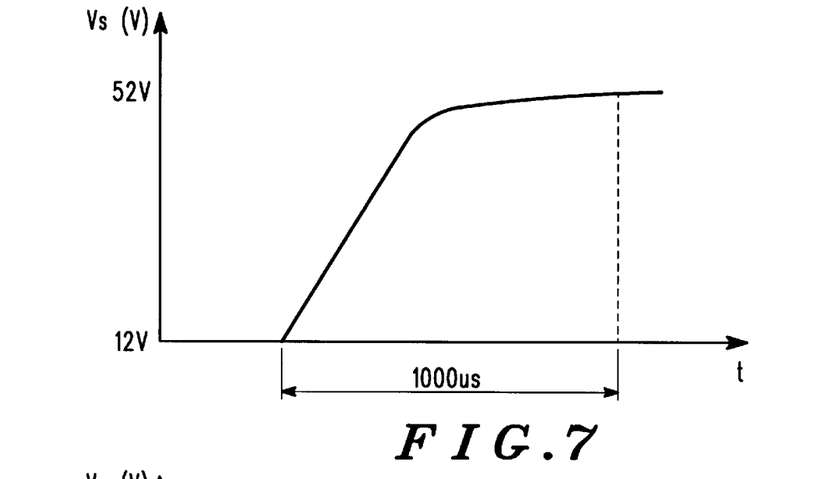
FIG. 7 is a representation of the rise time of the pulses shown in FIG. 6.
Figure 8:
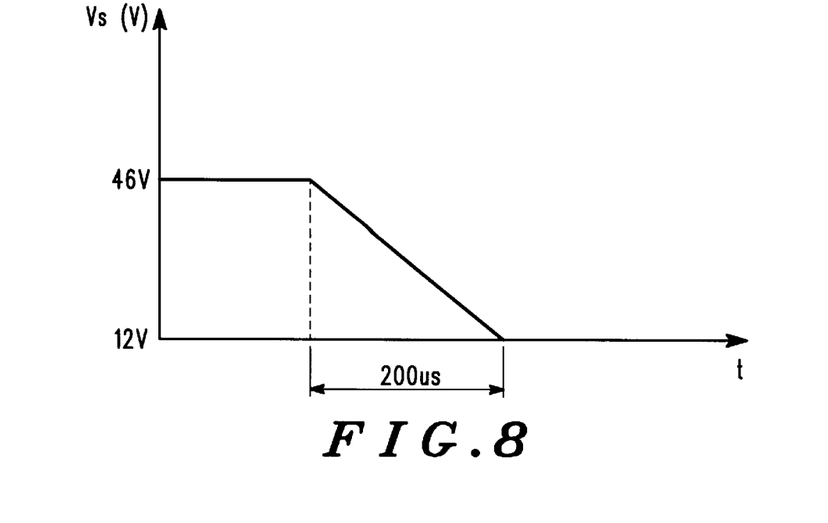
FIG. 8 is a representation of the fall time of the pulses show in FIG. 6.

Case 2. FIG. 6 shows the voltage level at the storage capacitor 4 when capacitors 4 and 5 are both chosen to have a value of 100 nF. FIGS. 7 and 8 respectively show the rise and fall times of the voltage pulses shown in FIG. 6.

Figure 9:
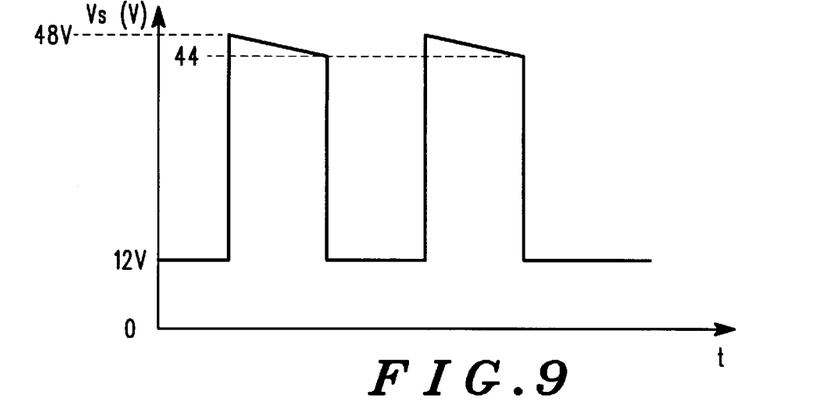
FIG. 9 is a representation of the voltage pulses seen on the storage capacitor in the circuit of FIG. 1 as the current through the inductive element is switched on and off for third selected values of capacitance.
Figure 10:
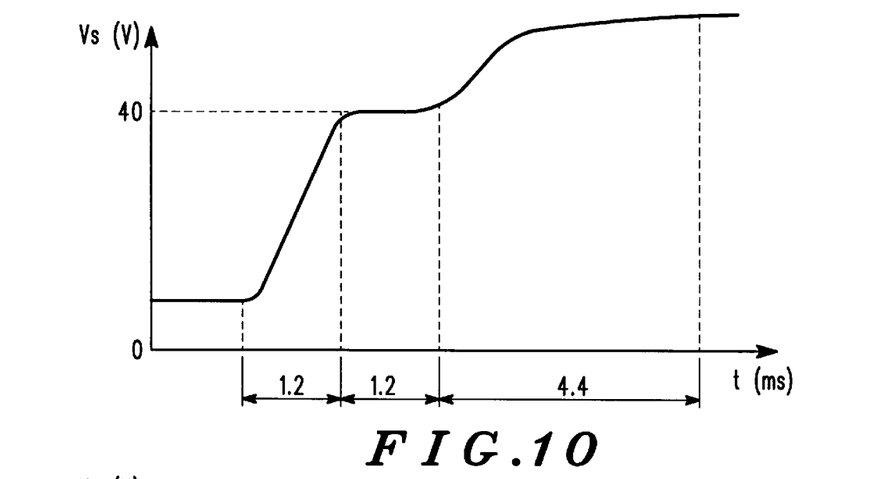
FIG. 10 is a representation of the rise time of the pulses shown in FIG. 9.
Figure 11:
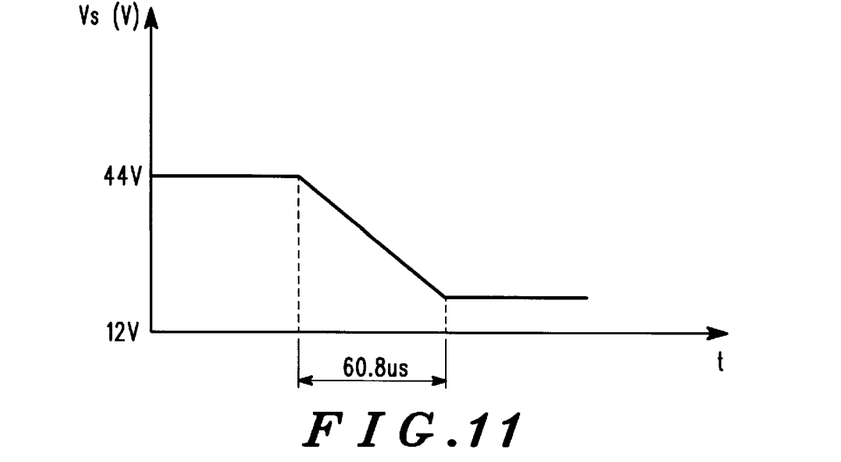
FIG. 11 is a representation of the fall time of the pulses show in FIG. 9.

Case 3. FIG. 9 shows the voltage level at the storage capacitor 4 when capacitors 4 and 5 are respectively chosen to have values of 10 nF and 100 nF. FIGS. 10 and 11 respectively show the rise and fall times of the voltage pulses shown in FIG. 9.

Since the amount of energy that can be stored on a capacitor for a given voltage is proportional to the value of the capacitance, it is desirable that the storage capacitor 4 be as large as possible in order to permit maximum energy transfer from inductive element 3. In this case, the size of the transfer capacitor 5 may be selected by using the following criteria: If the transfer capacitor 5 is small compared to the storage capacitor, more charge is transferred to the storage capacitor on each cycle, but the peak voltage level at the switch 1 is large, leading to the danger of component damage. Conversely, if capacitor 5 is made larger in size, the danger of component damage is reduced, but less charge is transferred to the storage capacitor; hence more energy is lost as heat by the current discharging through diode 8. The optimum, in many cases, is with the values of the capacitors 4 and 5 equal. As can be seen from FIGS. 3, 6 and 9 this results in the largest energy storage.

In a test circuit representing the first embodiment, it has been found that if capacitors 4 and 5 are selected to have an equal capacitance, then 54% of the energy stored in the inductive element 3 is stored on capacitor 4 and is available to energise it the next time the current is switched on. In the test circuit, though, this value is limited largely by the comparatively high resistance of the inductance coil.

The skilled reader will be aware that the above embodiments are only illustrative and that many other arrangements are envisaged.

Figure 12:
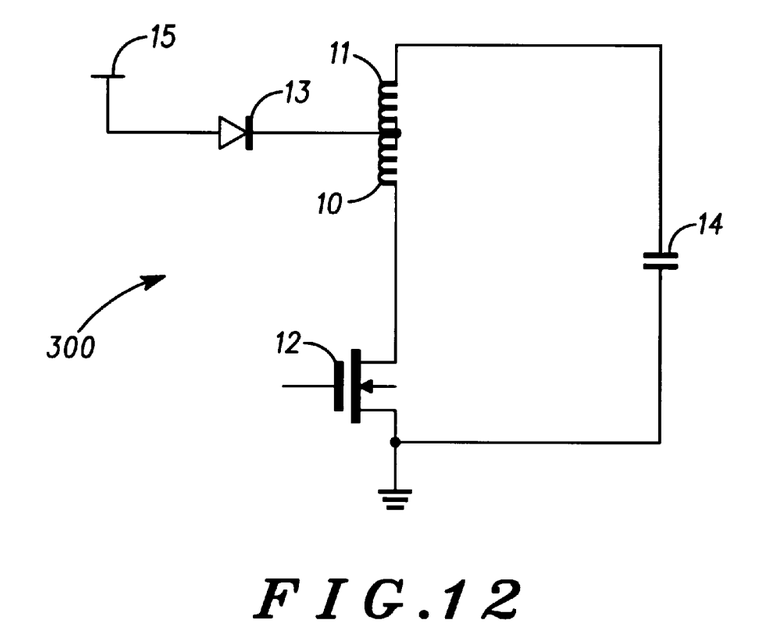
FIG. 12 shows a circuit diagram of a switching circuit for an inductive load in accordance with a third embodiment of the invention.

The switching circuit 300 of FIG. 12 represents a third embodiment of the present invention. This embodiment differs from the first two embodiments in that a tapped inductor having two inductive elements 10 and 11 with a common tap electrode is provided, rather than a single, untapped inductor.

In the switching circuit 300 of FIG. 12, a switch 12 is coupled to the first inductive element 10, the tap electrode is connected to a first reference voltage terminal 15, in this case a power supply, via a diode 13 and storage capacitor 14 links the second inductive element 11 and a second reference voltage, which in this example is ground.

When switch 12 is in a closed position, current from the power supply flows through the first inductive element 10; at the same time storage capacitor 14 is charged up to the potential of the power supply. If switch 12 is opened at this time, the decrease in the load current through the first inductive element 10, and hence in the magnetic field generated in the core of the inductor, is passed onto the second inductive element 11. In this way the sudden decrease in current in the first inductive element induces a high voltage spike across the second inductive element 11, which is passed onto storage capacitor 14. As in the previous embodiments, reverse biased diode 13 prevents the stored charge leaking back to the power supply.

If switch 12 is closed again before the charge on storage capacitor 14 has decayed away, then the initial current will be supplied to both the first and second inductive elements by storage capacitor 14. This initial current establishes a magnetic field in the core of the inductor, which is common to the first and second inductive elements. Once the voltage across the storage capacitor 14 drops to about the level of the power supply, diode 13 becomes forward biased and the load current is provided by the power supply through inductive element 10 only.

Compared to the first two embodiments, the circuit of FIG. 12 has the advantage of fewer components. This arrangement would therefore be advantageous in circuits where a tapped inductor can be conveniently included.

As described above the invention enables most of the energy stored in the magnetic field of an inductive load to be saved when the current through the inductive element is switched off, and then to be used the next time the load is energised. As part of this process it also generates a higher initial voltage for the inductive load, which will may mean that the time to reach a predetermined peak magnetic field in the inductive load will be reduced.

In order for the energy stored on the storage capacitor to be effectively returned to the inductive load, the off-time of the load current should not be large compared to the discharge time of the storage capacitor. However, even if the off-time is large the circuit will still function, but some or all of the energy stored on the capacitor will have been lost as heat. In this case the inventive circuit is still advantageous because the energy will be dissipated over a long time period compared to a conventional snubber circuit.

Figure 13:
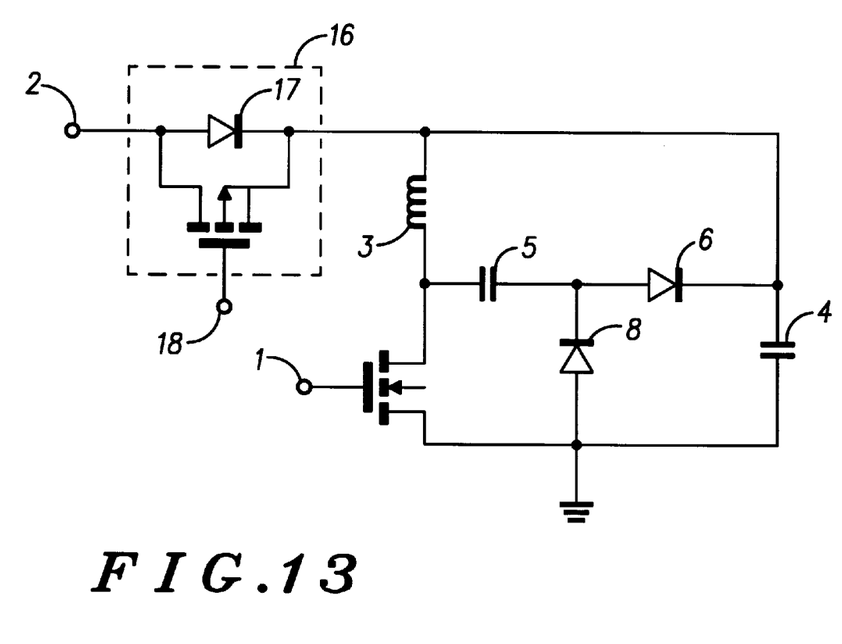
FIG. 13 shows a circuit diagram of a switching circuit for an inductive load in accordance with a fourth embodiment of the invention.

Referring now also to FIG. 13, there is shown a fourth embodiment of the invention. In this embodiment, the diode 7 of FIG. 1 is replaced by by a diode 17 surrounded by a P-Channel MOSFET (Metal Oxide Semiconductor Field Effect Transistor) 16. The MOSFET 16 has a gate terminal coupled to a control terminal 18, a source terminal coupled to the first reference voltage terminal 2 and a drain terminal coupled to the inductive element 3. The diode 17 may be a discrete device (similar to the diode 7) or it may be incorporated in the MOSFET 16 as an inherent body device, between the source and drain terminals.

When the MOSFET 16 switched off, the circuit of FIG. 13 operates in the same way as the circuit of FIG. 1. When the MOSFET 16 is switched on, diode 6 then acts as a recirculation diode for the inductive element 3. Furthermore if MOSFET 16 is switched on when switch 1 is on then the diode 17 is short circuited by the MOSFET 16 which considerably improves efficiency at low supply voltage or at high current.

In operation this circuit operates as follows. Initially, both the switch 1 and the MOSFET 16 are turned on. Current in the inductive element 3 increases until the required level is reached, at which time the switch 1 is repeatedly toggled to hold the current at the required level.

When a quick switch-off is required both the switch 1 and the MOSFET 16 are switched off, and the energy from the inductive load is transferred to the capacitor 4 via capacitor 5 and diode 6.

When subsequent current levels are required, the switch 1 is switched on without the MOSFET 16, causing the inductive element 3 to be fed from the high voltage stored on capacitor 5 such that the initial current rise is much larger than at initial switch on.

When the required current is reached, the MOSFET 16 is switched on and the switch 1 is repeatedly toggled to hold the current at the required level, as before.

Figure 14:
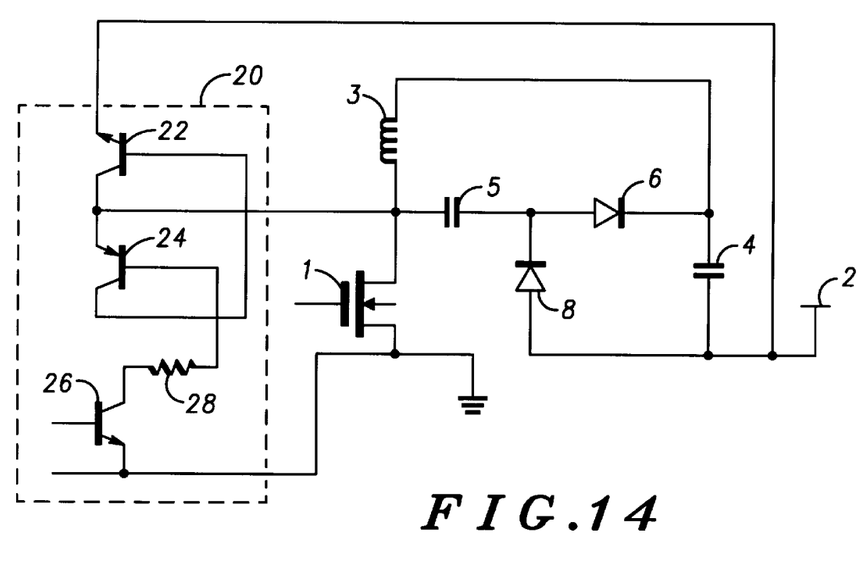
FIG. 14 shows a circuit diagram of a switching circuit for an inductive load in accordance with a fifth embodiment of the invention.

Referring now also to FIG. 14, there is shown a fifth embodiment of the invention. This embodiment comprises the circuit of FIG. 2, with the provision of a bipolar transistor switch arrangement 20, which provides a similar function to that of the MOSFET 16 of the fourth embodiment.

The arrangement 20 comprises a first bipolar transistor 22 (n-p-n) having an emitter electrode coupled to the first reference voltage terminal 2, a collector electrode coupled to the second electrode of the inductive element 3, and a base electrode to be further described below.

A second bipolar transistor 24 has an emitter electrode coupled to the second electrode of the inductive element 3, a collector electrode coupled to the base electrode of the first bipolar transistor 22, and a base electrode to be further described below.

A third bipolar transistor 26 has a collector electrode coupled via a resistor 28 to the base electrode of the bipolar transistor 24, an emitter electrode coupled to ground, and a base electrode arranged to be switched.

The bipolar transistor 22 is arranged to operate in a similar way to the MOSFET 16 of the fourth embodiment. Transistors 24 and 26 provide a level shifting arrangement such that the switching voltage reference is 0 V. If the bipolar transistor 22 is switched on when switch 1 is off, the energy in the inductive element 3 is recirculated via the diodes 6 and 8 and so decays slowly. In this embodiment the bipolar transistor 22 and the switch 1 must not be on at the same time, and this may be achieved by a simple logic circuit.

Uses for this technique are manyfold, including automotive applications such as injector or brushless motor drives, or more general applications using, say, relays or other inductive loads.

I claim:

1. A switching circuit for an inductive load comprising:
   a first inductive element having first and second electrodes, said first electrode being coupled to a reference voltage and said second electrode being connected to a switch for controlling a current through said first inductive element; and
   an energy storage device coupled to said second electrode of said first inductive element by a coupling capacitor, said energy storage device being operative to store energy from said first inductive element when said current through said first inductive element is interrupted by said switch, said energy storage device further being operative to return said stored energy to said first inductive element when said current through said first inductive element is restored by said switch.

2. A switching circuit according to claim 1, further characterized in that said energy storage device is capacitively coupled to said first inductive element by a second inductive element.

3. A switching circuit according to claim 1, further characterized in that said energy storage device is inductively coupled to said first inductive element by a second inductive element.

4. A switching circuit according to claim 3, wherein said first and second inductive elements are comprised within a tapped inductor, a first electrode of said second inductive element and said first electrode of said first inductive element being coupled to a tap electrode of said tapped inductor, and a second electrode of said second inductive element being coupled to said energy storage means.

5. A switching circuit in accordance with claim 1, further comprising a second switch coupled for selectively switching said first electrode of said first inductive element to said reference voltage, such that when the first switch is off, the energy storage device is selectively prevented from storing energy from and returning energy to the inductive element.

6. A switching circuit according to claim 5 wherein the second switch is a metal oxide semiconductor device.

7. A switching circuit according to claim 5 wherein the second switch is a bipolar transistor.

* * * * *